United States Patent [19]

Baldi

[11] Patent Number: 4,830,931

[45] Date of Patent: May 16, 1989

[54] DIFFUSION ALUMINIZING AND PACK THEREFOR

[75] Inventor: Alfonso L. Baldi, Wynnewood, Pa.

[73] Assignee: Alloy Surfaces Company, Inc., Wilmington, Del.

[21] Appl. No.: 538,541

[22] Filed: Oct. 3, 1983

Related U.S. Application Data

[63] Continuation-in-part of Ser. No. 507,174, Jun. 23, 1983, Pat. No. 4,694,036, and a continuation-in-part of Ser. No. 359,212, Mar. 18, 1982, Pat. No. 4,443,557, and Ser. No. 281,405, Jul. 8, 1981, Pat. No. 4,708,913, and Ser. No. 172,671, Jul. 28, 1980, Pat. No. 4,435,481, said Ser. No. 507,174, is a continuation-in-part of Ser. No. 299,789, Sep. 4, 1981, abandoned, said Ser. No. 359,212, and Ser. No. 299,789, is a continuation-in-part of Ser. No. 302,979, Sep. 17, 1981, abandoned, and Ser. No. 25,456, Mar. 30, 1979, Pat. No. 4,349,612, which is a continuation-in-part of Ser. No. 963,313, Nov. 24, 1978, abandoned, said Ser. No. 281,450, and Ser. No. 172,671, is a continuation-in-part of Ser. No. 25,456.

[51] Int. Cl.$^4$ .................... B32B 15/20; C23C 16/12
[52] U.S. Cl. .................... 428/552; 428/558; 428/653; 427/253
[58] Field of Search ............... 428/607, 553, 550, 552, 428/558, 653; 148/6.15 R, 6.2; 427/253

[56] References Cited

U.S. PATENT DOCUMENTS

| | | | |
|---|---|---|---|
| Re. 29,212 | 5/1977 | Baldi et al. | 427/253 |
| 3,785,854 | 9/1984 | Baldi | 148/6.16 |
| 3,936,539 | 2/1976 | Baldi | 427/253 |
| 4,066,806 | 1/1978 | Speirs et al. | 427/253 |
| 4,327,134 | 4/1982 | Baldi | 427/253 |
| 4,350,719 | 9/1982 | Baldi | 427/253 |
| 4,467,016 | 8/1984 | Baldi | 427/253 |

OTHER PUBLICATIONS

Hawley, *The Condensed Chemical Dictionary*, 9th Ed., 1977, p. 206.

*Primary Examiner*—John F. Terapane
*Assistant Examiner*—Eric Jorgensen
*Attorney, Agent, or Firm*—Connolly & Hutz

[57] ABSTRACT

Diffusion aluminizing with chromium or silver chloride, bromide or iodide that is not significantly soluble in or reactive with water. Hydrogen can be excluded from diffusion aluminizing atmosphere when aluminizing maraging steels or other substrates sensitive to hydrogen. Aluminized iron powders can be boronized to increase their exothermic heat upon exposure to air after leaching out aluminum.

15 Claims, No Drawings

DIFFUSION ALUMINIZING AND PACK THEREFOR

The present application is a continuation in part of application Ser. No. 507,174 filed June 23, 1983, (now U.S. Pat. No. 4,694,036 granted Sept. 15, 1987) which in turn is a continuation-in-part of application Ser. No. 299,789 filed Sept. 4, 1981 (subsequently abandoned). The present application is also a continuation-in-part of applications Ser. No. 359,212 filed Mar. 18, 1982 (U.S. Pat. No. 4,443,557 granted Apr. 17, 1984), Ser. No. 281,405 filed July 8, 1981 and Ser. No. 172,671 filed July 28, 1980 (U.S. Pat. No. 4,435,481 granted Mar. 6, 1984), and the contents of the two last-mentioned applications are hereby incorporated herein as though fully set forth. Ser. No. 359,212 and Ser. No. 299,789 are each continuations-in-part of application Ser. No. 302,979 filed Sept. 17, 1981 (subsequently abandoned), and Ser. No. 25,456 filed Mar. 30, 1979 (U.S. Pat. No. 4,349,612 granted Sept. 14, 1982); and Ser. No. 25,456 is in its turn a continutation-in-part of still earlier application Ser. No. 963,313 filed Nov. 24, 1978 and subsequently abandoned. Ser. Nos. 281,405 now U.S. Pat. No. 4,708,913 and Ser. No. 172,671 are also continuations-in-part of Ser. No. 25,456.

The present invention relates to aluminizing, particularly low temperature diffusion aluminizing such as is utilized in the foregoing patent applications. It also relates to diffusion boronizing and other activating techniques.

Among the objects of the present invention is the provision of improved diffusion aluminizing and boronizing techniques.

Additional objects of the present invention include novel activated metals and novel pack compositions for diffusion aluminizing.

Still further objects of the present invention are the provision of a diffusion technique for substrates that are sensitive to moisture or hydrogen.

The foregoing as well as still further objects of the present invention will be more fully understood from the following description of several of its exemplifications.

Low-temperature diffusion aluminizing is a very desirable widely practiced treatment. Not only is it less expensive than high-temperature diffusion aluminizing but it produces more desirable results in many cases. Thus U.S. Pat. No. 3,764,373 points out that the lower temperature preserves compressive stresses developed beforehand in a substrate as by peening. Martensitic steels tend to lose strength when subjected to temperatures of about 1000° F. or higher. The pyrophoric activation of the above-noted parent applications is accomplished best by a treatment sequence that begins with low-temperature aluminizing, and the lower the aluminizing temperature the more effective is the activation.

Unfortunately, the diffusion activator used in low-temperature diffusion aluminizing is usually anhydrous $AlCl_3$, and its use involves problems. For commercial operations an activator is used, since otherwise the diffusion takes place extremely slowly. A diffusion activator like $NH_4Cl$ which is very desirable for use in high-temperature diffusion aluminizing, does not work well in the low-temperature aluminizing of metal substrates. As also explained in U.S. Pat. No. 3,764,373 however, anhydrous $AlCl_3$ can cause attack of the substrates when the diffusion coating pack used is prepared under high humidity conditions. Furthermore, anhydrous $AlCl_3$ vigorously reacts with moisture in the air even in relatively low humidity conditions.

According to the present invention the diffusion aluminizing of metal substrates at temperatures below 1400° F., and particularly below 1100° F., is conducted with an activator which is a chloride, bromide or iodide of chromium or silver that is not significantly soluble in or reactive with water. Anhydrous chromic chloride is a particularly desirable activator by reason of its relatively low cost.

The activators of the present invention give excellent results regardless of the humidity under which they are stored and loaded into a diffusion coating retort. The 60% humidity level described in U.S. Pat. No. 3,764,373 as critical for $AlCl_3$ activation, is not a problem with the activators of the present invention, and it is not necessary to provide special low-humidity pack-preparation rooms.

The aluminum diffusion packs of the present invention are particularly desirable when used in a diffusion atmosphere essentially free of hydrogen to aluminize substrates such as maraging steels that develop hydrogen-type embrittlement when diffusion aluminized at low temperatures. Maraging steels are martensitic age-hardening steels containing no more than about 0.03% carbon. Their martensitic nature is contributed by a nickel content of at least about 12%, and they are more fully described in the Maraging Steels chapter (pages 445–452) of Steel Products Metals Handbook published by American Society for Metals, 9th Edition, Volume 1 (1978).

To obtain acceptable diffusion aluminized products of this type, essentially no hydrogen should be present during such aluminizing. It is even necessary to avoid formation of the small amount of hydrogen that results when the aluminum in an aluminizing pack reacts with the HCl formed by the humidity-induced hydrolysis of $AlCl_3$ activator present in the pack. However where a diffusion coating retort can be loaded under very low humidity conditions, under 30% relative humidity for example, maraging steels and other hydrogen-sensitive metals can be successfully aluminized with anhydrous $AlCl_3$ activator at temperatures below 1400° F. Inasmuch as heat treatment of maraging steels is generally limited to not over 950° F. so as to avoid loss of strength, such limit is best observed when diffusion coating maraging steel.

The low-temperature diffusion aluminizing of steels to make a pyrophorically-activated product as described in the parent applications, is also desirably combined with a diffusion boronizing that follows the aluminizing. The introduction of as little as 2% boron into such aluminized steels noticeably increases the pyrophoric heat evolution after the steel is subsequently activated by leaching out some of the aluminum and the thus-activated boronized steel exposed to the air.

Diffusion coating to catalytically activate the surface of a metal foam, such as nickel foam described in U.S. Pat. No. 3,111,396, is particularly desirable inasmuch as such a foam presents a very large metal surface and does not have the fragility of thin foil or screening. The diffusion-coating treatment generally introduces into the surface of the metal being activated a relatively high concentration of an embrittling metal such as aluminum, and fragile shapes such as foil and thin screening tend to break unless very carefully handled during this treatment.

The catalytic activation of platinum and other metals of the platinum family is preferably applied to very thin substrates in the interest of reducing the amount of such expensive metals need, and here also a metal foam shape as described in U.S. Pat. No. 3,111,386 is desirable.

To minimize having thin nickel foil rendered too fragile the diffusion step can be carried out at minimum temperatures to reduce the depth of the diffusion case. Thus a 0.1 to 0.5 mil case can be provided on a nickel foil 1 to 2 mils thick by aluminizing at a temperature between 650° and 800° F. The foil is increased in thickness by the aluminizing, so that a heavy aluminizing of a one-mil thick foil can yield a product 3 or more mils thick with each face having an aluminized case and both cases together occupying about 2.6 mils of that thickness.

The fragility of thin foils when diffusion coated, can also be offset by having the metal of the foil in the form of a surface layer securely held on a carrier foil or sheet made of metal that does not have the objectionable fragility and can be subsequently separated from that surface layer. Thus a 5 mil thick aluminum sheet can have electroplated on one face a one mil thick layer of nickel or cobalt, using a preliminary flash coating of chromium or zinc to get the nickel or cobalt to adherently deposit. The final coated aluminum sheet is then subject to a 20-hour diffusion treatment at 750° to 850° F. in a hydrogen-bathed atmosphere to cause the aluminum to diffuse most of the way through the nickel or cobalt layer, after which the resulting product is subjected to caustic leaching to dissolve the aluminum. This leaves a catalytically active nickel or cobalt foil that contains a residual small content of diffused-in aluminum and holds itself together adequately for normal handling. Although pyrophoric, its catalytic activity is not as high as is available from a pack diffusion process without the aluminum carrier sheet, but it does a good job of catalyzing hydrogenation and other chemical reactions including ammonia oxidation and HCN formation. Of particular interest, a Ni or Co plating formed by electroplating in the above manner has a particularly low density thus limiting the amount of mass needed per unit volume of catalyst.

Both faces of the aluminum sheet can be given nickel or cobalt platings in which case the corners or edges of the plated sheet can be trimmed off to expose the aluminum substrate for leaching.

A very effective zinc flash for the foregoing plating sequence is obtained by a $\frac{1}{2}$ to 1 minute dip of the cleaned aluminum sheet at room temperature in the following solution:
NaOH 525 grams
ZnO 100 grams
$FeCl_3.6H_2O$ 1 gram
$NaKC_4H_4O_6.4H_2O$ 10 grams
Water to make one liter Platinum and other catalytic metals can similarly be converted to catalytic foil, and other leachable metals like zinc can be used as the supporting foil in place of aluminum. The supporting layer can also be made by spraying molten aluminum or zinc on a surface of the foil that is to be activated.

Palladium is best catalytically activated with zinc. A simple diffusion of about 1 to 30 milligrams of zinc per square centimeter of palladium surface, followed by leaching with strong, at least 10%, HCl in water at 95° C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with $\frac{1}{2}$% $NH_4Cl$, and heating for 4 hours at 600° F. in a hydrogen-bathed or argon-bathed atmosphere. This effects a zinc pick-up of 4 mg/cm$^2$, essentially all of which is leached out by 20% HCl in 10 minutes. The resulting screen is pyrophoric when exposed to air.

Zinc can be similarly diffused into titanium foil in a hydrogen-bathed or argon-bathed atmosphere from such a zinc-containing pack. As an example a 4 mil thick titanium foil is embedded in a pack having the following composition:
80 g Zn
16 g Al
305 g $Al_2O_3$
4 g $AlCl_3$
and subjected to 10 hours of diffusion at 950° to 1000° F. The foil picks up about 3.5 milligrams of zinc per square centimeter. It is worthy of note that the titanium does not become seriously embrittled by such treatment, and can be bent around a $\frac{1}{8}$-inch radius without cracking. The diffused-in zinc can be leached out with 20% boiling NaOH solution to leave a very active catalytic surface. Titanium activated this way still retains a little of the zinc and can be used as a conventional electrolysis electrode, or as a substitute for the photosensitive electrodes described in the Augustynski et al paper in the Journal of the Electrochemical Society, Volume 124, No. 7, pages 1063-64 (1977).

Titanium activated by aluminizing and leaching can also be so used. Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photo-anode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful. A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen peroxide appears to form during the foregoing photolysis and some exothermic heat is also generated and can be used to help keep the photolysis combination warm.

For some purposes, such as catalytic alkylation, it is helpful to have a catalytic tin surface. Inasmuch as tin is a very low melting metal, it is helpful to first diffuse the tin into a high-melting support such as nickel. By way of example an 80-mesh nickel gauze made of 4 mil thick wire, is embedded in the following pack:
Tin powder 73 grams
Nickel powder 27 grams
Alumina 300 grams
$NH_4Cl$ 4 grams which pack had been pre-fired at 1000° F. for 5 hours and then had its NH₄Cl content replenished. Diffusion is conducted in hydrogen at 1400° F. for 5 hours to give a 20 milligram per square centimeter pick-up. The resulting tin-containing gauze after removal from the pack, is subjected to post diffusion by heating in hydrogen at 1600° to 1700° F. for 5 hours to leave the diffusion case about 1.3 mils thick. This product is now activated by a pack diffusion at 850° to 900° F. for 30 hours using a pack having 20% powdered aluminum, 80% powdered alumina, and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1 mil thick layer of copper on a 1 mil thick palladium foil, heating the copper-palladium combination in hydrogen at 1050°–1100° F. for 12 hours to diffuse the copper deeply into the palladium, and then diffusion coating the resulting product under hydrogen in a pack containing 10% zinc, 90% alumina, and activated with ½% NH₄Cl. Ten hours of such treatment at 660°–690° F. produces a pick-up of about 7 milligrams of zinc per square centimeter of foil surface and a 0.7 mil thick case the surface stratum of which contains about 25% zinc. The final step in the activation is a leaching in 30% HCl for 3 minutes at about room temperature followed by 10 minutes more at about 212° F. in 15% HCl.

The pack diffusion to activate any of the catalysts of the present invention can be effected in one step or in multiple diffusion steps under different conditions to vary the distribution of the diffused-in metal. Regardless of how the diffusion is carried out, the pyrophoricity of the leached product can be entirely blocked by immersing the activated surface in an aqueous solution of a chromate such as an alkali metal, magnesium or ammonium chromate or chromic acid. A concentration of about 1% chromate ion is all that is needed to inhibit essentially all the otherwise intense pyrophoric activity of nickel for example, after only a few seconds contact. Smaller concentrations, as low as 0.1% chromate ion, will also be effective if kept in contact for longer times.

A catalyst so inhibited can be conveniently stored or shipped without being immersed in a protective liquid. Moreover the catalyst can subsequently be pyrophorically reactivated by merely treating it for about 2 minutes with 5% aqueous NaOH, preferably at 10° C. Rinsing away this treating liquid will then leave the catalyst with almost all of its original activity.

The chromate treatment does not significantly reduce the catalytic activity of the catalysts even though it kills the pyrophoricity. Indeed as shown in co-pending application Ser. No. 531,444 filed Sept. 12, 1983 (subsequently abandoned), such treatment can increase catalytic activity.

The catalytic activity withstands intense evacuation, although the activated surface gives off large quantities of hydrogen under the influence of the lowered pressure.

Activated nickel surfaces can also be modified by dipping for a few seconds in aqueous hydrogen peroxide. A three volume percent H₂O₂ solution modifies the surface and turns it black so that it is no longer pyrophoric. The modified surface is however still catalytic and will for example show a strong decrease in overvoltage when used as a cathode or anode in electrolyzing aqueous NaOH to generate gas. The activation of platinum or its alloys can be similarly modified by immersion in aqueous H₂O₂ or in aqueous HCl at least 20% strong.

A readily ignited metal such as titanium or magnesium in foil or wire form can also be given a nickel coating, as by rolling, and the nickel coating then rendered pyrophoric. To ignite the ignitable metal the coating should be at least about 0.4 mil thick.

The pyrophoric metals, regardless of how they are produced, can be plated as by electrolytic coatings from alkaline cyanide baths of zinc, cadmium, silver, tin or copper, without significantly diminishing their pyrophoricity. Such coatings that are over about 0.2 mil thick will significantly reduce the pyrophoric action.

Platinum activated by the aluminum diffusion and leaching, still contains a significant amount of the aluminum. Even when heated to high temperatures, such as 1800° to 2300° F. for days or weeks, that residual aluminum remains in the outermost 0.3 mil or so of the metal. This platinum wire so treated shows greater useful life at very high temperatures, e.g. 1800° F. or higher. The increased life appears to be a characteristic of platinum that is alloyed with from about 0 to about 5% aluminum and has been heated to from 1800° to 2300° F. for at least a week. This improvement is most significant for very fragile wires such as those not over about 10 mils thick. Thus wires less than 4 mils thick when used as catalytic screens in gaseous reactions, are subjected to vibratory flexure by the flow of reacting gases, as well as attack by naturally occurring catalyst poisons swept along by those gases. The aluminum-containing platinum stands up much better in such service than aluminum-free platinum.

Platinum freshly activated by aluminum diffusion and leaching, has a characteristic fissured surface illustrated in U.S. Pat. No. 4,154,705 and it would not be expected that longer mechanical life could be obtained with such a surface. However after days of service at extremely high temperatures, the fissures become less pronounced, but the wire remains rough.

The presence of up to about 15% of other platinum metals alloyed with the platinum and the aluminum, does not significantly reduce the life-lengthening effect of the aluminum. Thus a platinum-rhodium alloy screen made of 3 mil thick wire containing 10% rhodium, that is further alloyed with 2% aluminum, also shows a markedly long service life at 1800° F. and higher. Similar results are obtained when iridium is substituted for some or all of the rhodium.

Instead of introducing the aluminum into the platinum by diffusion, it can more inexpensively be introduced by melt alloying, for example at the same time rhodium is alloyed with the platinum. Wire drawn from the resulting alloy does not have the very high catalytic activity of platinum activated by surface diffusion and leaching as described above, but it is still strongly catalytic and it also has the long service life.

When the aluminum is introduced into a platinum screen by low-temperature diffusion, that is diffusion below about 900° F., the aluminum introduction is generally very slight or completely absent at locations such as wire crossover points where one wire touches another and at least partially blocks the diffusing action. Although little or no aluminum is located at those points, the resulting screen performs even better than one which has been subjected to heavy aluminizing that reaches 100% of its surface. A similar improvement can be obtained on heavily aluminized screen by following the caustic leach with an acid treatment, HCl for example, that leaches out extra amounts of aluminum.

The improved service life can be obtained when the aluminum-carrying platinum is subjected to the preliminary heat treatment in air, in a vacuum, in nitrogen, hydrogen or in catalytically reacting gases. It appears that 1800° to 2300° F. temperature for the minimum of one week is the key to long life.

Pyrophorically activated nickel and iron also retain some of the aluminum or zinc or the like used to activate them, even though these activating metals are leached out even with strong hot aqueous caustic for 12 hours or more. When such leached pyrophoric products are dipped in 1 to 5% aqueous $H_2O_2$ for about ¼ to about 1 hour, their pyrophoricity is sharply reduced or entirely eliminated. Notwithstanding such reduction the products are still strongly catalytic. A nickel screen having forty 10 mil wires per inch, and diffusion aluminized at 950° F. for 16 hours followed by 2 hours of leaching in 20% aqueous NaOH at 180° F. with a final 30 minute dip in 2% aqueous $H_2O_2$, develops an activated case about 1.6 mils thick and shows a very low overvoltage as a cathode in electrolyzing water containing a little dissolved KOH. Although the freshly leached screen is not pyrophoric, after two to four weeks electrolyzing the water, it tends to become pyrophoric. At this point a three-hour dip in 160° F. tap water will eliminate the pyrophoricity.

Although the screen pyrophoricity tends to increase while it is used as an electrolysis electrode, its catalytic effectiveness tends to very gradually drop during such use. After several years of such use, the screens are desirably re-activated by subjecting them to another aluminizing treatment followed by another leaching out of aluminum. The activated surface can be removed beforehand by prolonged exposure to dilute aqueous mineral acid.

In some cases the leached activated or re-activated screens retain a little pyrophoricity after the $H_2O_2$ treatment, even though that treatment is with 5% $H_2O_2$ for six hours. This retention is more pronounced the lower the aluminizing temperature, so long as the aluminum pick-up effected by the aluminizing is at least about 8, preferably over 20, milligrams per square centimeter of the screen's wire surface. The foregoing dip of the $H_2O_2$-treated screen in hot water for at least about 30 minutes or the $H_2O_2$ treatment after such dip, effectively eliminates the residual tendency to pyrophoricity, even when the aluminizing temperature is as low as 750° F.

The water for the final dip can be slightly acidulated, in which case the dip temperature can be reduced and still effect the desired pyrophoricity elimination. At a pH as low as 5, the lowest dip temperature should be about 145° F. A little acetic acid added to the water reduces its pH to about 3.5 or a little lower, and reduces the minimum dip temperature to about 40° F. The same temperature reduction is provided with stronger acids such as sulfuric and hydrochloric acids, although they bring the pH down to about 1 or less.

The higher the dip temperature, the shorter the dip time needed. Dips as long as 12 hours are extremely effective but when the water used in the dip is at or above about 170° F., adequate results are obtained by a dip of about 1 hour or less. There is a substantial amount of gassing as well as aluminum extraction during the dip, particularly when the dip water is close to its boiling point, and care should be taken to permit the elimination and release of gas from the dip water.

The caustic leaching out of aluminum in the activating step can be effected in two or more stages if desired, with or without an intervening dip in the acidulated or unacidulated water.

The foregoing dips in unacidulated or acidulated water also keep an activated $H_2O_2$-treated nickel screen from developing pyrophoricity when it is later welded to a support. The heat of the welding tends to restore the pyrophoric activity, and the thickness of the activated case should be not more than 1.6 mils, preferably not more than 1.5 mils, to avoid welding problems.

Highly prolonged dips appear to effect removal of all residual diffused-in aluminum, leaving a nickel product that is particularly desirable for a water-electrolyzing cathode.

Although the water dip is highly effective for eliminating pyrophoricity of activated nickel or iron that has been or is to be treated with $H_2O_2$, it does not eliminate or even significantly reduce the pyrophoricity of these activated metals without the $H_2O_2$ treatment. Applying the $H_2O_2$ treatment after the water dip is just as effective for pyrophoricity elimination as applying the $H_2O_2$ treatment followed by the water dip.

Activated nickel made by diffusion zincizing followed by leaching with an acid such as sulfuric or hydrochloric acid tends to have little or no pyrophoricity, although it is catalytic and has a very low overvoltage when used as cathode or anode in the electrolysis of water. Nickel activated this way need only be given the above $H_2O_2$ treatment to assure the complete absence of pyrophoricity.

Raney nickel and iron powder also can have their pyrophoricity eliminated by the foregoing combination of $H_2O_2$ treatment and water dip.

The foregoing is illustrated by the following examples.

EXAMPLE 1

A number of one-piece compressor rotor assemblies for a jet engine, which assemblies are made of type 410 stainless steel, are packed under 75% relative humidity in an aluminizing powder pack having the following composition by weight:

20% powdered aluminum
80% powdered alumina to which is added ¼% violet anhydrous chromic chloride flakes ground to pass through a 35 mesh screen.

The pack is contained in a carbon steel diffusion coating retort that is loosely covered and loaded into an outer retort through which a stream of argon is flushed while it is heated as in U.S. Pat. No. 3,764,371. Thermocouples are also packed in the work-carrying retort. After the argon has displaced essentially all the air the argon in the flushing stream is replaced by hydrogen. Heating is continued to bring the thermocouples to about 875°–900° F., and to hold them at that temperature for 12 hours.

The heating is then terminated, permitting the retorts to start cooling down. At about 300° F. in the cooldown, the flushing stream is switched back to argon, and when the thermocouples show about 175° F. the furnace is lifted away from the retorts, the outer retort also lifted away from the packed inner retort, and the packed retort unloaded.

The workpieces are water washed, dried, blasted with a stream of compressed air and fine glass frit to clean away pack residues, and inspected. No sign of etching is observed.

Conducting of the same heat with the same pack except that the energizer is anhydrous aluminum chloride, usually leaves etch marks on the finished workpieces, in some cases the etch marks extending through the diffusion coating and into the substrate. The higher the humidity in the room in which the packing is done, the higher the incidence of etch marks when the $AlCl_3$ energizer is used.

With the $CrCl_3$ energizer there are practically no etch marks, even when the packing is conducted at about 85% relative humidity. Also the $CrCl_3$-energized pack needs no break-in heat treating cycle to produce etch-free results, whereas without such break-in the $AlCl_3$-energized pack does not coat well.

Results corresponding to those described above are obtained with other metal halides like $CrBr_3$, $CrI_3$ and $AgCl$ that are not reactive with or significantly soluble in water. Similarly the aluminum content of the pack can be as low as about 5% or lower, and as high as about 50% or higher, different refractory diluents such as kaolin and MgO can be used, the diffusion temperatures can vary from about 700° to about 1400° F., and the time at temperature varied from about ¼ hour to about 30 hours. When aluminizing hardenable grade stainless steels, temperatures of at least 800° F. and no higher than about 900° F. are preferred. The content of energizer in the pack can be as high as ½% or even higher. Because of its expense, it is preferred to hold the energizer content to no higher than ⅓%, and to use as little as ¼% or even 1/5% whenever feasible. Chromium halide activator flakes over about 35 mesh in size, that is larger than about 20 mils, tend to cause non-uniform coating and are not desired.

The important lowering of etch damage is obtained with substrates made of other stainless steels or low alloy steels or even plain carbon steels. With some steels that are susceptible to significant hydrogen embrittlement, argon is used as the retort flushing gas throughout the entire diffusion coating heat. Maraging steels have such susceptibility, and their aluminizing is shown in the following example:

EXAMPLE 2

The procedure of Example 1 is repeated with the following modifications. The workpieces packed in the inner retort are maraging steel compressor blade retainers for a jet engine, the maximum diffusion temperature is 890°–900° F., and argon is the only flushing gas used. Aluminized workpieces of the highest quality are obtained.

As noted above, the aluminizing of maraging steels should be conducted at a temperature no higher than 950° F., inasmuch as sustained higher temperatures cause these steels to lose some of their strength. Diffusion temperatures lower than about 825° F. are not particularly effective with maraging steels and require unduly prolonged diffusion times.

Other inert gases such as neon, krypton and helium can be used in place of the argon in Examples 1 and 2. In the event some hydrogen finds its way into the diffusion coating atmosphere, the aluminized blade retainers can become embrittled, but such embrittlement is eliminated by stripping off the aluminide case and then repeating the aluminizing heat, making sure no hydrogen is admitted. The aluminide stripping is readily effected by the technique described in U.S. Pat. No. 4,327,134.

Exposure to hydrogen appears to take place when the aluminizing is conducted in a so-called glass-seated retort as described in U.S. Pat. No. 2,844,273, under autogenously-generated atmosphere.

The presence of a chromium halide in the diffusion aluminizing pack as in Examples 1 and 2, does not cause the deposit of any significant amount of chromium with the diffusion coating. On the other hand excessively large quantities of a chromium halide will cause the aluminum in the aluminizing pack to become alloyed with sufficient chromium to sharply slow down the aluminizing action. By keeping the chromium halide content to less than 1%, no significant slowdown is effected.

The silver halide energizers of the present invention will cause the diffusion coating thus formed to contain a very slight amount of silver, but that amount is almost undetectable and it can be ignored.

The diffusion aluminizing of the present invention can also be conducted with aluminum-silicon alloys instead of with pure aluminum. Such alloys containing up to about 15% silicon are suitable and do not introduce a significant amount of silicon in the workpieces. Somewhat more rapid aluminizing is effected with such alloys, particularly those having low melting points like the eutectic 12% silicon alloy, and diffusion temperatures can be lowered about 25° to 50° F. or diffusion times lowered by about 20%.

The diffusion coating packs of the present invention can be re-used, but for such re-use a fresh amount of energizer should be added. Inasmuch as the energizer is essentially totally consumed during a diffusion coating heat, the amount added for re-use is generally the same as that added in the original use. Also the energizers of the present invention can be added to re-use an aluminizing pack previously used with $AlCl_3$ or other energizer. In addition, packs used with an energizer of the present invention can be re-used with $AlCl_3$ or other energizer. A little aluminum metal can be added to a used pack to make up for the aluminum that has diffused out.

Diffusion-aluminized workpieces are best protected against high-temperature corrosive attack, as in jet engines, by a top coating as in Example I of U.S. Pat. No. 3,948,689, or Example III of U.S. Pat. No. 4,141,760, or in patent application Ser. No. 417,214 filed Sept. 13, 1982 (subsequently abandoned), or in Canadian Pat. No. 779,173. Particularly good results are obtained with 0.1 mil thick coatings from suspensions of 1 to 3 micron ground aluminum particles in the aqueous magnesium phosphate-chromate formulations of the Canadian patent. Such very small particle sizes are more effective than the 5 to 10 micron size suggested in that patent. The aqueous suspension can also contain colloidal alumina or silica instead of applying such colloidal material as a preliminary layer in the manner described in the U.S. patents. Whichever modification is used, the top coating should be baked at about 650° to 700° F. for at least about 30 minutes, to provide still better protection. It can be alternatively or additionally subjected to barrel burnishing with steel, ceramic, or plastic burnishing media. The top coating can also be applied as multiple layers.

The aluminizing of the present invention can also be used to prepare aluminized steel, iron, nickel or other substrates for conversion to Raney-type activated metals, as described in U.S. Pat. No. 4,154,705. Both self-supporting substrates and powdered substrates can be so activated and such activation of powders is described in parent application Ser. No. 507,174. This type of treatment provides the greatest degree of activation for foils or other self-supporting substrates when the aluminizing is effected at the lowest temperatures—below 1000° F.—and at such low temperatures energizers such as inexpensive ammonium halides give undesirable diffusion cases.

The pyrophoric effects of the Raney-type activated metal is further improved by diffusing boron into the surface being activated. This is shown in the following example:

EXAMPLE 3

Three-hundred grams of powdered 325 mesh $FeAl_2$ is thoroughly mixed with 10 grams powdered boron and 6 grams of powdered $NaBF_4$. The mixture is placed in a carbon steel retort which is then fitted into a tube furnace, and heated while a flushing gas is passed through the tube as in Example 1. A heat of 1800° F. held there for 1½ hours under hydrogen, introduces about 7% boron into the $FeAl_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15–16% aqueous NaOH that is cooled to keep it below 120° F., followed by washing, the activated particles remaining are quite pyrophoric and on exposure to air heat up to temperatures of about 1000° F. Higher and lower leaching concentrations and temperatures can also be used, but are less desirable.

Longer diffusion boronizing provides, after leaching, an activated iron-aluminum-boron alloy powder containing as much as 30% boron based on the weight of its iron, and which upon exposure to air heats up to over 1200° F. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when $FeAl_3$ powder is used in place of the $FeAl_2$, when alloys of intermediate proportions are used, and when the corresponding nickel-aluminum alloys are used. Some of the alloys are not as brittle, and therefore not as easily grindable as others. If the iron-aluminum alloy powder particles being boronized are over about 1 millimeter in size, the boronizing treatment times should be substantially lengthened if the boron penetration is to be complete. Other boronhalides such as ammonium fluoborate, $BBr_3$ and $BI_3$ can be used as energizers. In general the energizer content of the pack should be from about 1 to about 3% by weight, and the diffusion temperature at least about 1400° F.

By not using an inert refractory diluent in the boronizing pack, it becomes unnecessary to later separate such diluent from the boronized powder.

The foregoing boronizing of self-supporting substrates such as foils requires much more care and should be conducted with inert refractory diluent in the pack. Thus conducting the same boronizing on lengths of one-mil thick aluminized iron foil is awkward because such foil is extremely brittle and difficult to handle. The following is a preferred example.

EXAMPLE 4

Such boronizing can be satisfactorily effected in the following powder pack:
200 grams powdered alumina
10 grams powdered boron
5 grams sodium or ammonium fluoborate,
at 950° F. for 18 hours, or at 1050° F. for 3 hours, in a hydrogen-bathed atmosphere. The boron then penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free of boron, are stored out of contact with air or oxygen to preserve their pyrophoricity. Water is not a suitable preserving liquid for the activated boron-containing powders. Acetone preserves them for at least three weeks, as does an azeotropic mixture of trifluoro-trichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosoltype container from which they are readily discharged to provide a cloud of pyrophorically oxidizing particles.

Titanium can also be aluminized and/or boronized by the same type of treatments, to make it more resistant to corrosive attack. For this purpose the aluminum is not leached out. It is also very desirable to diffusion coat titanium in the absence of hydrogen and in the complete or substantially complete absence of conventional halide activators like $AlCl_3$ and $NH_4Cl$. Thus engine compressor blades made of Ti6A14V can be embedded in a pack of 20% Al-Si alloy powder containing 12% silicon, and 80% alumina, completely free of energizer, and at 1300° F. for 14 hours under argon, acquires a protective aluminide case 0.5 to 1 mil thick. Using pure aluminum instead of the Al-Si alloy reduces the case thickness by about half.

Adding ¼% $AlCl_3$ or $NH_4Cl$ energizer to the pack causes the titanium substrate to be significantly embrittled. However the aluminizing can be speeded by using a pack that had been pre-fired with such a halide energizer for a time long enough to drive out essentially all the energizer—at least one to two hours at 700° F. or higher. It appears that some energizer remains or some change is caused, to make the pre-fired pack much more effective in aluminizing the titanium. In any event the resulting aluminizing produces thicker cases, and can be readily effected at temperatures as low as 1000° F. or in times as short as 5 hours.

The addition to the pack of about 1/10% of a titanium halide such as $TiCl_2$, preferably sealed in a polyethylene tube so as to be protected against exposure to the atmosphere, is also helpful to speed up the diffusion coating. The polyethylene tube melts before the pack reaches diffusion temperature, releasing its contents.

The aluminized titanium compressor blades can then be boronized instead of or before applying a top coating as described above in connection with the Canadian patent. A suitable boronizing pack for this purpose is the diluent-containing pack of Example 4, using ammonium fluoborate as the energizer and with added titanium powder in an amount about half the amount of boron powder, by weight. A 0.3 mil boronized case is thus formed at 1075° F. for 14 hours in argon. The titanium powder helps keep the titanium substrate from being attacked by the halide in the pack, and can also be added to the pack used for aluminizing titanium. It can also be omitted, particularly when only a thin diffusion coating is desired. When the powdered titanium is used, it can range from about 1/5 the boron content to about equal the boron content by weight. Boron being a very high melting material, it can be used with little or no refractory diluent, particularly at diffusion temperatures low enough to keep the workpiece surfaces from reaching a sintering condition. On the other hand the boron content of a boronizing pack can be as low as 2%, although at least 4% is preferred. To be sure that no sintering takes place an inert refractory diluent like $Al_2O_3$, kaolin or MgO can be present in the pack in a concentration of at least 30%.

The re-use of packs containing sodium fluoborate energizer can be complicated by the gradual build-up of sodium fluoride with each use. This problem does not appear to arise when ammonium fluoborate is the energizer.

Obviously many modifications and variations of the present invention are possible in light of the above teachings. It is, therefore, to be understood that within the scope of the appended claims the invention may be practiced otherwise than as specified.

What is claimed:

1. The process of diffusion coating a metal substrate with aluminum at a temperature below 1400° F. in the presence of an activator, in which process the activator is a chloride, bromide or iodide of chromium or of silver not significantly soluble in or reactive with water.

2. The process of claim 1 in which the metal substrate is a maraging steel and the diffusion coating atmosphere is essentially free of hydrogen.

3. The process of claim 2 in which the diffusion coating atmosphere is bathed in an inert gas.

4. The process of claim 3 in which the inert gas is argon.

5. The process of claim 1 in which the activator is anhydrous chromic chloride having a particle size not larger than about 20 mils.

6. The process of claim 1 in which the diffusion coating is effected by placing the metal substrate against a diffusion coating powder pack that has not been broken in.

7. A diffusion aluminizing pack containing powdered low-temperature aluminizing metal and a low-temperature aluminizing activator, and the activator is a chloride, bromide or iodide of chromium or of silver not significantly soluble in or reactive with water.

8. The pack of claim 3 in which the activator is anhydrous chromic chloride.

9. The pack of claim 8 in which the pack contains at least about 1/5% and less than 1% activator by weight.

10. The pack of claim 8 in which the anhydrous chromic chloride is in the form of particles no longer than about 20 mils in size.

11. The process of simultaneously aluminizing a plurality of separate diffusion-aluminizable steel parts, which process produces an essentially etch-free diffusion-aluminized product and is characterized by conducting the diffusion aluminizing at a temperature no higher than about 1100° F., using as the diffusion energizer anhydrous chromic chloride that is not significantly soluble in or reactive with water.

12. The process of claim 11 in which the diffusion-aluminizing is effected in an aluminizing pack held at a temperature below 1000° F. and the energizer is in the form of particles no larger than about 20 mils mixed in the pack.

13. The process of claim 12 in which the diffusion-aluminizable steel is a stainless steel and the diffusion-aluminizing is conducted in a retort loaded under a humidity of over about 60%.

14. The process of diffusion aluminizing maraging steel, in which a process which the diffusion aluminizing is conducted in the essential absence of hydrogen and of materials that can generate hydrogen during the diffusion coating.

15. The process of aluminizing a maraging steel, which process is characterized by diffusion aluminizing the maraging steel at a temperature not over 950° F. in an atmosphere that is essentially free of hydrogen.

* * * * *